United States Patent [19]

Shinada

[11] Patent Number: 4,907,055
[45] Date of Patent: Mar. 6, 1990

[54] OPTICAL SEMICONDUCTOR DEVICE
[75] Inventor: Hidetoshi Shinada, Kanagawa, Japan
[73] Assignee: Fuji Photo Film Co., Ltd., Kanagawa, Japan
[21] Appl. No.: 263,769
[22] Filed: Oct. 28, 1988
[30] Foreign Application Priority Data Oct. 28, 1987 [JP] Japan .................... 62-272715

[51] Int. Cl.[4] .................... H01L 31/12
[52] U.S. Cl. .................... 357/30; 357/17
[58] Field of Search .................... 357/19, 17, 30
[56] References Cited

U.S. PATENT DOCUMENTS 4,787,691 11/1988 Lorenzo .................... 357/19

Primary Examiner—Martin H. Edlow
Attorney, Agent, or Firm—Sughrue, Mion, Zinn, Macpeak & Seas

[57] ABSTRACT

An optical semiconductor device of broad area structure comprising an active region positioned between a p-type semiconductor region having a stripe-like anode electrode and an n-type semiconductor region having a cathode electrode, the anode electrode having a broad stripe width in which the photon density is increased to amplify the light with the aid of injected into the active region dependent on the current density flowing between the anode and cathode electrodes, wherein the density distribution of the injected carriers exhibits Gauss distribution in the widthwise direction of the stripe width. Therefore, it is possible to supply such a current as to produce the density distribution of the injected carriers with no excess or shortage.

16 Claims, 5 Drawing Sheets

OPTICAL SEMICONDUCTOR DEVICE

BACKGROUND OF THE INVENTION

1. Field of the Invention

The present invention relates to an optical semiconductor device in which a light of the same phase and the same wavelength as an incident ray is inductively emitted to amplify the incident ray for producing a laser beam.

2. Description of the Prior Art

In a usual semiconductor device 40 of a gain and waveguide type stripe structure, as shown in FIG. 6, when an electric current is applied in a width or a stripe width S of an anode electrode 41, thereof, the electric current flows through a semiconductor region 42, i.e. p-type semiconductor region in this case to diverge laterally and transversely. Therefore, carriers injected into an active region 44 are diffused laterally and transversly away from the stripe width. As a result, the mountain-shaped density distribution of the injected carriers is formed with the stripe region located at the center. In case of the stripe width smaller than approximately 10 μm, the injected carriers can be consumed effectively. Thus, even in an attempt to produce the near field pattern using a light of the basic mode (0-order mode), an output power of that light can be enhanced efficiently.

However, when the stripe width is set broad (larger than 10 μm), the current density flowing vertically downward through the stripe width is lowered, and hence the balance between that non-diverging current density and the diverging current density (i.e., distribution ratio defining the mountain-shape) is lost and a central portion of the distribution curve of current density becomes flat as shown in FIG. 7.

The current density distribution having such a characteristic brings about carriers or gain which is needless and detrimental to excitation to be solely based on the basic mode. More specifically, in the stripe width region, there occur both a portion where the carriers are excessive and a portion where they are deficient, which will cause saturation of output power. The portion where the carriers are excessive causes heat generation, and hence a service life of the semiconductor light amplifier itself is shortened. Further, since the output power cannot have the ideal distribution as shown in FIG. 4, both of the carrier density distribution and the gain distribution exhibit characteristics similar to that of the current density distribution, as shown in FIG. 7.

SUMMARY OF THE INVENTION

In view of the foregoing status in the prior art, an object of the present invention is to provide an optical semiconductor device which can supply such an electric current as to obtain the density distribution of carriers necessary for output power solely based on the basic mode with no excess or shortage, irrespective of size of the stripe width.

The present invention resides in an optical semiconductor device of broad area structure comprising a first semiconductor region having a stripe-like anode electrode disposed on its principal plane, a second semiconductor region having a cathode electrode disposed on its principal plane, an active region formed between both the semiconductor regions, and opposite end faces on the incident and emission sides perpendicular to a direction in which a light proceeds through the active region, the anode electrode having a broad stripe width in which the photon density is increased to amplify the light with the aid of carriers injected into the active region dependent on the current density flowing between the anode and cathode electrodes, wherein the density distribution of the injected carriers exhibits Gauss distribution in the widthwise direction of the stripe width.

Amplification of light in the active region is effected through the process that the photon density is increased by consuming carriers distributed over the active region dependent on a current value flowing between the anode and cathode electrodes. The current flowing from the anode electrode is divided into a current vertically descending from the stripe width region toward the cathode electrode and a current diverging in the widthwise direction of the stripe width, thereby combinedly forming the predetermined current density distribution. In the present invention, a resistance value of the semiconductor region is so controlled as to regulate the current density distribution. In other words, the conductivity (or resistivity) between both the electrodes is varied while holding constant a current value, as a basic parameter, applied to one electrode, so that the current density distribution has a characteristic (Gauss distribution) under which carriers are consumed with no excess or shortage during excitation solely based on the basic mode (0-order mode).

Therefore, it is possible to solve the conventional disadvantage that the central portion of the current density distribution is flattened in case of broad area stripe structure, and hence to offer the output power in the steady basic mode.

DESCRIPTION OF PREFERRED EMBODIMENTS

Figure 1:
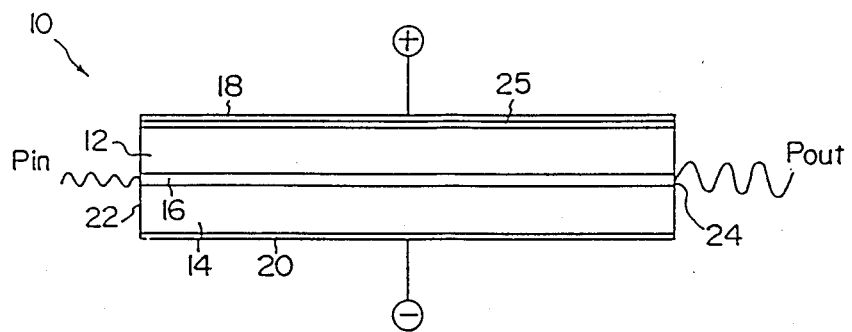
FIG. 1 is a side sectional view of a semiconductor laser according to a first embodiment of the present invention.
Figure 2:
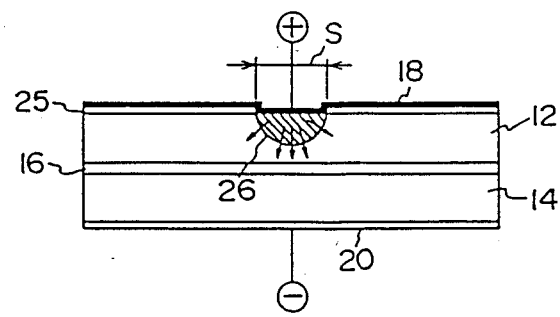
FIG. 2 is a front sectional view, on an emission side, of the semiconductor laser according to the first embodiment.
Figure 3:
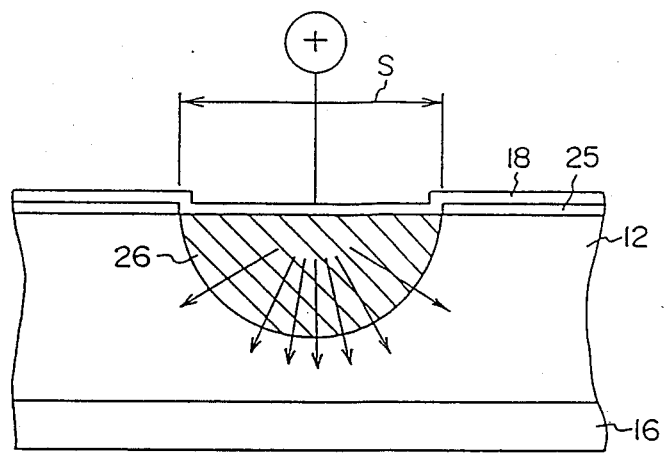
FIG. 3 is an enlarged view of a principal part in FIG. 2.

FIGS. 1 and 2 show a semiconductor 10 according to a first embodiment of the present invention. A p-type semiconductor region 12 and an n-type semiconductor region 14 are positioned on the upper and lower sides of an active layer 16, respectively. Therefore, the active region 16 has a belt-like shape. An anode electrode 18 and a cathode electrode 20 are attached to respective principal planes of the p-type semiconductor region 12 and the n-type semiconductor region 14. With a current flowing between the anode and cathode electrodes, a light entering an incident side end face 22 (lefthand end face in FIG. 1) is gradually amplified while reciprocating between the opposite end faces in the active region 16, and is then emitted from an emergent side end face 24 (righthand end face in FIG. 1).

As shown in FIG. 2, an insulating film 25 (SiO$_2$) is interposed between the anode electrode 18 and the p-type semiconductor region 12 excepting their central portions. Thus, because of the presence of the insulating film 25, the anode electrode 18 is conducted at only its central portion to the p-type semiconductor region 12. The width of this conducted portion is called a stripe width S, and a current applied to the anode electrode 18 is caused to flow into the p-type semiconductor region 12 only from a range of the stripe width S. Note that the stripe width of the semiconductor laser 10 used in this embodiment is set larger than 10 μm to provide a broad area structure.

In the p-type semiconductor region 12, there is formed a Zn diffused region 26 corresponding to the stripe width portion. As also shown in FIG. 2, the Zn diffused region 26 is defined by a substantially U-shaped arcuate line connecting between opposite ends of the stripe width portion, the arcuate line serving as a boundary to separate the interior and the exterior of the region 26 from each other. The Zn diffused region 26 can easily be formed into such a shape by adjusting a masking time to control the extent of the diffused region.

The Zn diffused region 26 has higher conductivity than the exterior area, so that the current flowing from the anode electrode 18 exhibits higher current density as it runs a longer distance in the Zn-diffused region 26. In other words, the current radially flowing from the stripe width S of the anode electrode 18 into the p-type semiconductor region 12 has higher current density in one component flowing vertically downward toward the cathode electrode 20, and lower current density in the other component diverging in the widthwise direction of the stripe width S.

Operation of this first embodiment will be described below.

When a predetermined current is applied to the anode electrode 18 of the semiconductor laser 10, the current flows between both the electrodes and carriers are distributed over the active region 16. In this state, when a light enters the incident side end face 22, the carriers are consumed to increase the photon density. In the active region 16, the incident light is reflected by its opposite end faces to reciprocate therebetween, while the light is being amplified through induced emission. At the time when the amount of the amplified light becomes equal to the amount of light lost by intermediate absorption and transmission through the reflective surfaces at opposite ends, there occurs an oscillation with which the light can be emitted from the emergent side end face 24.

Herein, with the presence of the insulating film 25 (SiO$_2$), the anode electrode 18 allows the current to flow toward the p-type semiconductor region 12 not from the area other than the central portion in FIG. 2, but only from the stripe width region at that central portion. The current flowing from the stripe width region first passes through the Zn diffused region 26. Since the Zn diffused region 26 has its boundary defined by the arcuate (U-shaped) line connecting between opposite ends of the stripe width region, a larger amount of current flows vertically downward toward the cathode electrode 20, while a smaller amount of current diverges radially.

Figure 4:
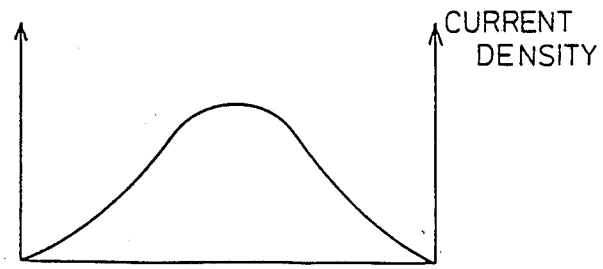
FIG. 4 is a characteristic graph showing the ideal current density distribution.

Therefore, both the current density distribution and the carrier density distribution produce a so-called mountain-shaped curve as shown in FIG. 4 and hence have their characteristics similar to that of the ideal Gauss distribution (basic mode) as obtained for the light intensity distribution.

When the light is amplified in the above state, the gain distribution also produces a mountain-shaped curve. Thus, in case of excitation solely based on the basic mode, the carriers are consumed with no excess or shortage along the stripe width, which will not cause any drawbacks of output power saturation due to shortage of the carriers and heat generation due to excess of the carriers.

In the above embodiment, the U-shaped Zn diffused region 26 is defined to provide two different resistance values between the interior and the exterior of the region 26. But, it may also possible to calculate the specific resistances of the p-type semiconductor region 12 and so on which reflect upon spreading of the current in a manner that the current density can produce a characteristic as shown in FIG. 4, and to form the Zn diffused region 26 for controlling spreading of the current based on the calculated values. In this case, there is present no definite boundary between the interior and the exterior of the Zn diffused region 26. The procedure of calculating the spreading resistance is as follows.

Figure 8:
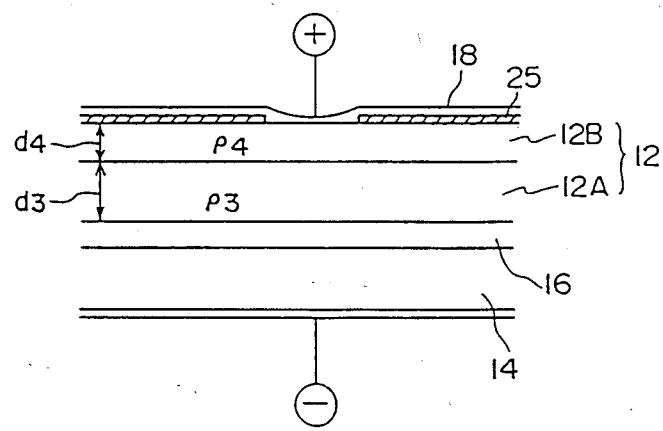
FIG. 8 is a front sectional view, on the emission side, showing specific resistances at the time of forming of a p-type semiconductor region.

Although the p-type semiconductor region 12 is shown as a single layer in the respective figures in the above embodiment, it is in practice formed by two layers of different components as shown in FIG. 8.

Assuming here that a p-type semiconductor region 12A near the active layer 16 has specific resistance of ρ3 and a thickness of d3, and a p-type semiconductor region 12B near the anode layer 18 has specific resistance of ρ4 and a thickness of d4, surface resistance ρs is expressed by the following equation:

$$\frac{1}{\rho s} = \frac{1}{(\rho 4/d4)} + \frac{1}{(\rho 3/d3)}$$

Accordingly, by setting values of ρ3, ρ4, d3, d4 to make ρs constant, the amount of lateral transversely spreading current can be changed.

A second embodiment of the present invention will be described below. In a semiconductor laser 30 used in this second embodiment, the same parts as those in the foregoing first embodiment are designated by the same reference numerals, and explanation of the identical structure will be omitted here.

Figure 5:
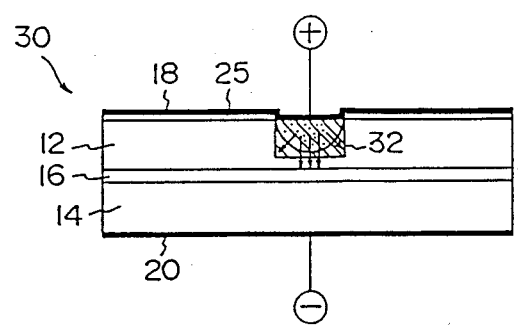
FIG. 5 is a front sectional view, on the emission side, of a semiconductor laser according to a second embodiment of the present invention.
Figure 6:
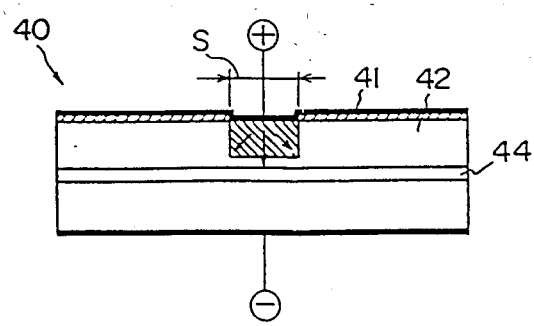
FIG. 6 is a front sectional view showing a conventional semiconductor laser.
Figure 7:
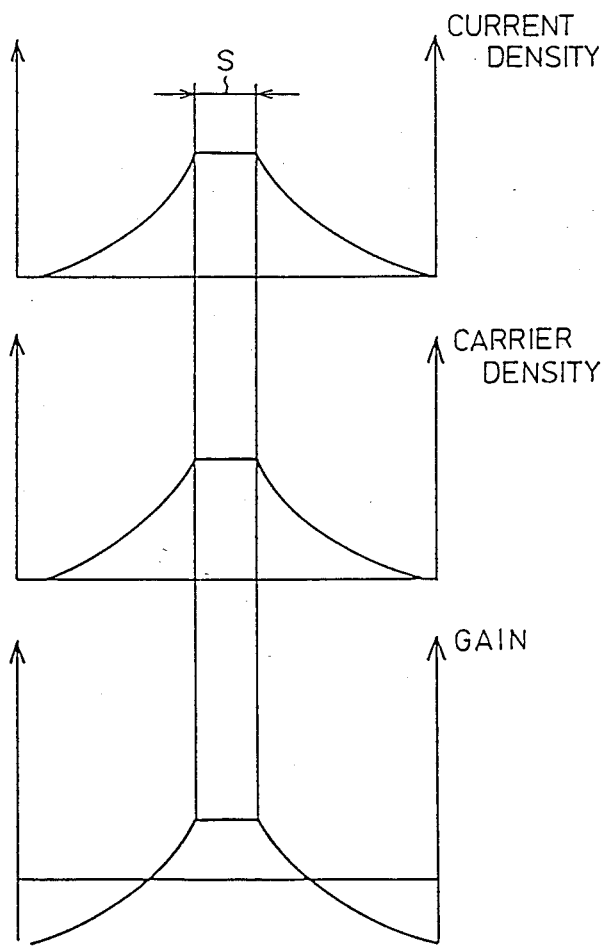
FIG. 7 depicts characteristic graphs showing distributions of the current density, carrier density and gain in the prior art, respectively.

In the second embodiment, as shown in FIG. 5, a Zn diffused region 32 has a normal shape, namely, a rectangular shape. By adding impurities (indicated by dots in FIG. 5) into the Zn diffused region 32 to vary resistivity of the p-type semiconductor region 12, the current density in the stripe width region is controlled. The amount of added impurities is selected to define the substantially U-shaped arcuate line connecting between opposite ends of the stripe width S as a boundary for only the Zn diffused region 32.

In case of the p-type semiconductor 12 as used in this second embodiment, the impurities are added in the form of acceptors which contribute to produce holes in the P-GaAs substrate. Such addition of the impurities or doping may be performed during the process of crystal growth, by diffusion from the crystal surface at high temperatures, or by ion injection.

Thus, with the larger amount of impurities, the resistivity of the p-type semiconductor region 12 is lowered and hence the larger amount of current flows therethrough. Consequently, the similar effect to the foregoing first embodiment is attained.

Note that although the second embodiment has been described as forming both the Zn diffused region and the impurity diffused region, it is not always necessary to provide the Zn diffused region.

In the above first and second embodiments, it has been explained in connection with the semiconductor lasers 10, 30 that carriers can effectively be consumed with the well balanced distribution of the carrier density and the photon density in the active region 16. However, the similar effect can be achieved also in a semiconductor light amplifier which is obtained by applying non-reflective coatings to both the incident side end face 22 and the emission side end face 24 of the semiconductor laser 10, 30.

As fully described above, the optical semiconductor device according to the present invention has an advantageous effect capable of supplying such a current as to obtain the density distribution of carriers necessary for output power solely based on the basic mode with no excess or shortage, irrespective of size of the stripe width.

What is claimed is:

1. An optical semiconductor device of a type having a broad stripe-like anode structure comprising:
   a first semiconductor region having a stripe-like anode electrode disposed on one of its principal surfaces;
   a second semiconductor region having a cathode electrode disposed on one of its principal surfaces;
   an active region formed between said first and second semiconductor regions, said active region for amplifying incident light propagating therethrough;
   wherein opposite end faces of a semiconductor structure formed by a combination of said first and second semiconductor regions and said active region represent incident and emission sides perpendicular to a direction in whih a light propagates through said active region; and
   wherein said anode electrode has a broad stripe width in which photon density is increased to amplify light with the aid of carriers injected into said active region dependent on the current density flowing between said anode and cathode electrodes, wherein a density distribution of the injected carriers exhibits Gaussian distribution in the widthwise direction of said stripe width.

2. An optical semiconductor device according to claim 1, wherein said density distribution of the injected carriers is caused to exhibit Gaussian distribution by forming, in said first semiconductor region, a Zn diffused region which is defined by an arcuate line connecting between opposite ends of the stripe width of said anode electrode and in which Zn is diffused.

3. An optical semiconductor device according to claim 1, wherein said density distribution of the injected carriers is caused to exhibit Gaussian distribution by forming, in said first semiconductor region, a rectangular Zn diffused region, one side of which is given by the stripe width of said anode electrode, and by forming in said Zn diffused region an impurity added region which is defined by an arcuate line connecting between opposite ends of the stripe width of said anode electrode and in which impurities are added.

4. An optical semiconductor device according to claim 1, wherein said density distribution of the injected carriers is caused to exhibit Gaussian distribution by forming, in said first semiconductor region, an impurity added region which is defined by an arcuate line connecting between opposite ends of the stripe width of said anode electrode and in which impurities are added.

5. An optical semiconductor device according to claim 1, wherein said stripe-like anode electrode is formed by the arrangement of an insulating film on said one principal surface of said first semiconductor region excluding a stripe-like aperture positioned where said stripe-like anode electrode is to be positioned, and conductive material on said insulating film and within said stripe-like aperture.

6. An optical semiconductor device according to claim 1, wherein said stripe width is of a width of not less than 10 $\mu$m.

7. An optical semiconductor device of a type having a broad stripe-like anode structure comprising:
   a p-type semiconductor region having a stripe-like anode electrode disposed on one of its principal surfaces;
   an n-type semiconductor region having a cathode electrode disposed on one of its principal surfaces;
   an active region formed between said p-type and n-type semiconductor regions, said active region for amplifying incident light propagating therethrough; and
   wherein opposite end faces of a semiconductor structure formed by a combination of said p-type and n-type semiconductor regions and said active region represent incident and emission sides perpendicular to a direction in which a light propagates through said active region; and
   wherein said anode electrode has a broad stripe width in which a photon density is increased to amplify light with the aid of carriers injected into said active region dependent on the current density flowing between said anode and cathode electrodes, wherein a density distribution of the injected carriers exhibits Gaussian distribution in the widthwise direction of said stripe width.

8. An optical semiconductor device according to claim 7, wherein said density distribution of the injected carriers is caused to exhibit Gaussian distribution by forming, in said p-type semiconductor region, a Zn diffused region which is defined by an arcuate line connecting between opposite ends of the stripe width of said anode electrode and in which Zn is diffused.

9. An optical semiconductor device according to claim 7, wherein said density distribution of the injected carriers is caused to exhibit Gaussian distribution by forming, in said p-type semiconductor region, a rectangular Zn diffused region, one side of which is given by the stripe width of said anode electrode, and by forming in said Zn diffused region, an impurity added region which is defined by an arcuate line connecting between opposite ends of the stripe width of said anode electrode and in which impurities are added.

10. An optical semiconductor device according to claim 7, wherein said density distribution of the injected carriers is caused to exhibit Gaussian distributiion by forming, in said p-type semiconductor region, an impurity added region which is defined by an arcuate line connecting between opposite ends of the stripe width of said anode electrode and in which impurities are added.

11. An optical semiconductor device according to claim 7, wherein said stripe-like anode electrode is formed by the arrangement of an insulating film on said one principal surface of said p-type semiconductor region excluding a stripe-like aperture positioned where said stripe-like anode electrode is to be positioned, and conductive material on said insulating film and within said stripe-like aperture.

12. An optical semiconductor device according to claim 7, wherein said stripe width is not less than 10 μm.

13. An optical semiconductor device for amplifying an incident light and emitting the amplified light comprising:
- a first semiconductor region having a stripe-like anode electrode disposed on one of its principal surfaces, a stripe width of said anode electrode being not less than 10 μm;
- a second semiconductor region having a cathode electrode disposed on one of its principal surfaces;
- an active region formed between said first and second semiconductor regions, said active region for amplifying incident light propagating therethrough and having an incident side end face from which light enters said active region and an emission side end face from which amplified light is emitted, said incident and emission side end faces being perpendicular to a direction in which light proceeds through said active region; and
- density distribution determining means for allowing the density distribution of carriers, which are injected into said active region dependent on the current density flowing between said anode and cathode electrodes, to exhibit Gaussian distribution in the widthwise direction of said stripe width.

14. An optical semiconductor device according to claim 13, wherein said density distribution determining means comprises a Zn diffused region which is formed in said first semiconductor region and defined by an arcuate line connecting between opposite ends of the stripe width of said anode electrode, and in which Zn is diffused.

15. An optical semiconductor device according to claim 13, wherein said density distribution determining means comprises an impurity added region which is defined by an arcuate line connecting between opposite ends of the stripe width of said anode electrode and in which impurities are added, said impurity added region being formed in a rectangular Zn diffused region, one side of which is given by the stripe width of said anode electrode, said Zn diffused region being formed in said first semiconductor region.

16. An optical semiconductor device according to claim 13, wherein said density distribution determining means comprises an impurity added region which is formed in said first semiconductor region and defined by an arcuate line connecting between opposite ends of the stripe width of said anode electrode, and in which impurities are added.

* * * * *